United States Patent
Hsieh et al.

(12)

(10) Patent No.: US 6,333,228 B1
(45) Date of Patent: Dec. 25, 2001

(54) METHOD TO IMPROVE THE CONTROL OF BIRD'S BEAK PROFILE OF POLY IN SPLIT GATE FLASH

(75) Inventors: Chia-Ta Hsieh, Tainan; Yai-Fen Lin, Hsin-Chu; Hung-Cheng Sung, Hsin-Chu; Jack Yeh, Hsin-Chu; Wen-Ting Chu, Kaohsiung County; Di-Son Kuo, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/534,160

(22) Filed: Mar. 24, 2000

(51) Int. Cl.$^7$ .................................................. H01L 21/336
(52) U.S. Cl. ..................... 438/257; 438/258; 438/262; 438/264; 438/265; 438/594; 438/593
(58) Field of Search ..................... 438/257, 258, 438/262, 264, 265, 260, 266, 594, 593

(56) References Cited

U.S. PATENT DOCUMENTS

| | | | |
|---|---|---|---|
| 5,858,840 | 1/1999 | Hsieh et al. | 438/266 |
| 5,945,705 * | 8/1999 | Liu et al. | 257/315 |
| 5,950,087 | 9/1999 | Hsieh et al. | 438/264 |
| 5,970,371 | 10/1999 | Hsieh et al. | 438/593 |
| 5,972,753 * | 10/1999 | Lin et al. | 438/256 |
| 5,976,934 * | 11/1999 | Hayakawa | 438/258 |
| 6,043,122 * | 4/2000 | Lin et al. | 438/257 |
| 6,093,607 * | 7/2000 | Hsieh et al. | 438/266 |
| 6,130,132 * | 10/2000 | Hsieh et al. | 438/264 |
| 6,144,062 * | 11/2000 | Mine et al. | 257/317 |

* cited by examiner

Primary Examiner—Matthew Smith
Assistant Examiner—V. Yevsikov
(74) Attorney, Agent, or Firm—George O. Saile; Stephen B. Ackerman; Sevgin Oktay

(57) ABSTRACT

A method is provided to improve the control of bird's beak profile of poly in a split gate flash memory cell. The control of the bird's beak profile is achieved in a first embodiment where the polycrystalline layer of the floating gate is annealed at a high temperature. The annealing promotes small grain size and hence smoother surface in the polysilicon, which in turn promotes sharper poly tip. The smoother poly surface also results in thinner inter-poly between the floating gate and the control gate, which together with the sharp poly tip, enhances the erase speed of the split-gate flash memory cell. In a second embodiment, the performance is further enhanced by providing an amorphous silicon for the floating gate, because the amorphous nature of the silicon yields a very smooth surface. This smooth surface is transferred to the recrystallized state of the silicon layer through annealing. Thus, a good control for the bird's beak is achieved. A sharp and short poly tip then results from a well controlled and well-defined bird's beak. Hence, an enhanced split-gate flash memory cell follows.

54 Claims, 10 Drawing Sheets

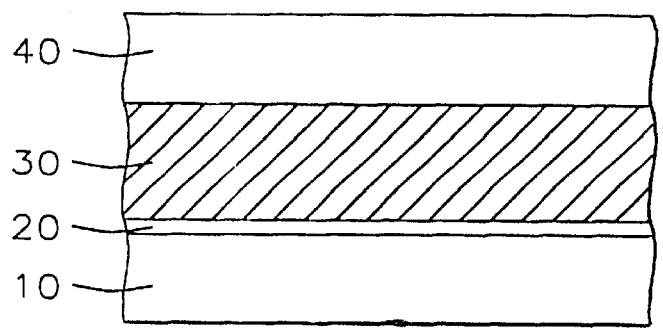
FIG. 1a – Prior Art
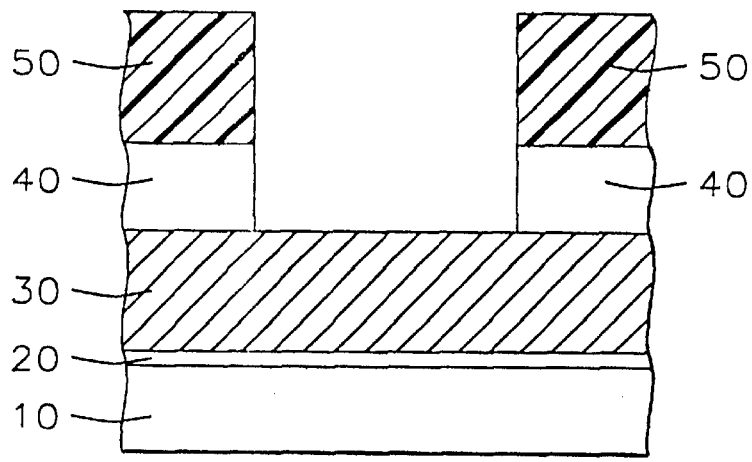
FIG. 1b – Prior Art
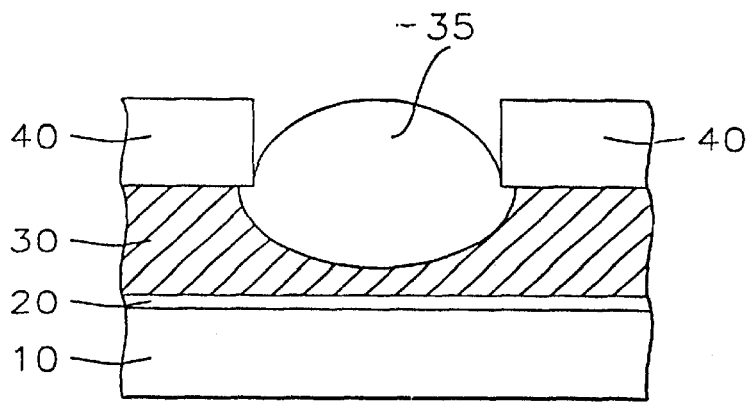
FIG. 1c – Prior Art

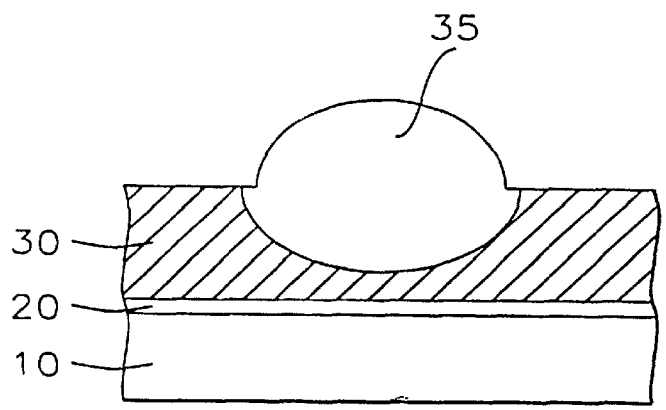
FIG. 1d - Prior Art
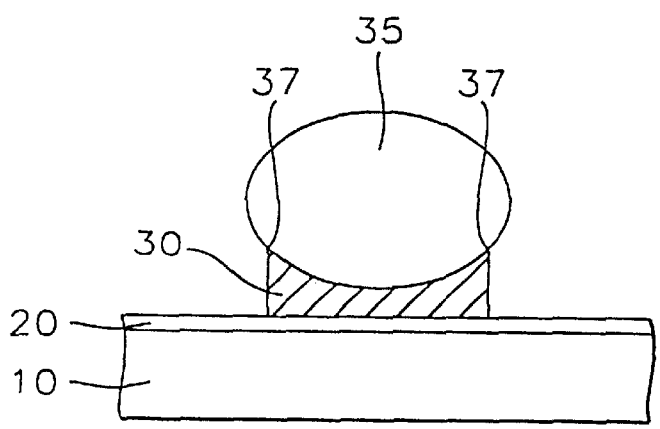
FIG. 1e - Prior Art
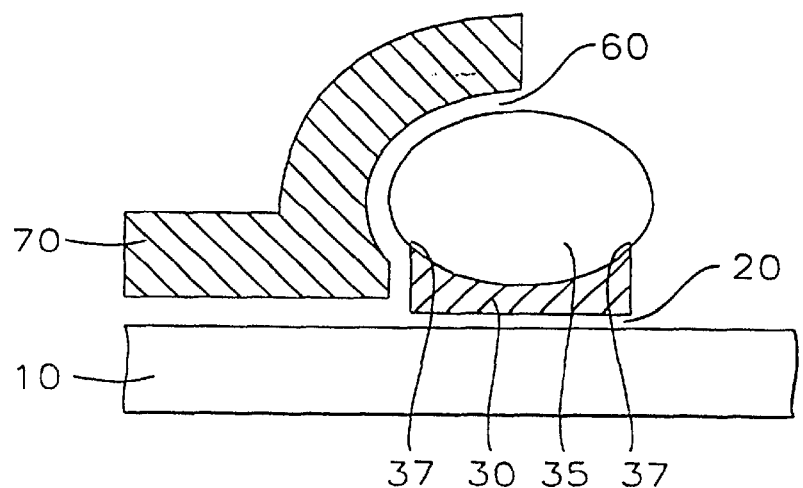
FIG. 1f - Prior Art

METHOD TO IMPROVE THE CONTROL OF BIRD'S BEAK PROFILE OF POLY IN SPLIT GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of improving the control of bird's beak profile of poly in split gate flash, which in turn improves the erase speed in split-gate flash cell.

(2) Description of the Related Art

The erase performance of a split gate flash memory is primarily governed by the sharpness of the poly tip and the thickness of the inter-poly oxide between the poly tip and the control gate. As is known in the art, the poly tip is formed at the time when the poly-oxide "cap" over the floating poly-gate of the memory cell is formed. The sharper and shorter the poly-tip, the faster is the erase speed of the cell. In other words, the geometry of the poly-tip determines the speed at which electron charge is transferred between the floating gate and the control gate of a split gate flash. In the current manufacturing line, the geometry can be controlled by various techniques, including a method where the different characteristics of polysilicon can be employed to advantage, as disclosed later in the embodiments of the present invention.

Most conventional flash-EEPROM cells use a double-polysilicon (poly) structure. The forming of a split gate flash cell is shown in FIGS. 1a–1f. In FIG. 1a, layer of gate oxide (20) is thermally grown over substrate (10) using conventional methods. Next, a first polysilicon layer (30) is formed followed by the deposition of nitride layer (40). A photoresist layer (50) is then formed over the substrate and then patterned with a floating gate pattern, which in turn, is etched into the nitride layer as shown in FIG. 1b. The photoresist layer, which is no longer needed, is removed. Next, the first polysilicon layer that is exposed in the pattern openings in the nitride layer is oxidized to form poly-oxide (35) as shown in FIG. 1c. Subsequently, the nitride layer is removed leaving the poly-oxide as shown in FIG. 1d, where now the poly-oxide serves as a hard mask to remove all the first polysilicon portions except those that are covered by the poly-oxide. As is well known in the art, this is usually accomplished by main etch followed by over-etch. It is at this etching step that the corner edge (37) is usually not too well controlled. The edge is sometimes rounded off, as seen in FIG. 1e, which is not desirable for achieving fast program erase speed. Sometimes, the edge can break also. It will be shown later in the embodiments of this invention that by employing a different process step, the sharpness of corner edge (37) can be preserved such that charge transfer (23) between substrate (10) and floating gate (30), and then the charge transfer (630) between the floating gate and control gate, (70), is fast. The control gate is formed by depositing a second polysilicon layer over intergate layer (60), also known as inter-poly, which separates the two polysilicon layers, namely, the floating poly-gate and the control poly-gate.

Several different methods of forming a split-gate flash memory cell are described in prior art. In U.S. Pat. No. 5,950,087, Hsieh, et al., provide a method for forming a split-gate flash memory cell with reduced size. This is accomplished by forming a self-aligned source line which reduces the number of surface contacts and also by preventing field oxide encroachment into the cell area. In another U.S. Pat. No. 5,970,371, Hsieh, et al., provide a method for forming a split-gate flash memory cell having a sharp beak of poly. The sharp beak is formed through an extra wet etch of the polyoxide formed after the oxidation of the first polysilicon layer. In still another US Patent Hsieh, et al., disclose a method for fabricating a self-aligned edge implanted split-gate flash memory cell to reduce leakage current and improve program speed. This is accomplished by forming a floating gate having thin portions and thick portions where the thin portions overly twice doped regions, thereby reducing the surface leakage current. In yet another U.S. Patent, Hsieh, et al disclose a method for forming a short and sharp gate bird's beak. This is accomplished by implanting nitrogen ions in the first polysilicon layer of the cell and removing them from the area where the floating gate is to be formed. Then, when the polysilicon layer is oxidized to form poly-oxide, the floating gate region without the nitrogen ions oxidizes faster than the surrounding area still having the nitrogen ions. Consequently, the bird's beak that is formed at the edges of the poly-oxide assumes a sharper shape with smaller size than that is normally found. This results in an increase in the erase speed of the memory cell.

The present invention discloses a method of controlling the integrity of the bird's beak in the first place, thereby assuring the integrity of the resulting poly-tip which in turn yields faster performance for the split-gate flash memory cell.

SUMMARY OF THE INVENTION

It is therefore an object of this invention to provide a method for controlling bird's beak profile of polysilicon in a floating gate in order to improve the erase speed of a split-gate flash memory cell.

It is another object of this invention to provide a method of forming a sharp poly tip in order to improve the erase speed of a split-gate flash memory cell.

It is still another object of this invention to provide a method of forming a thin inter-poly oxide between the floating gate and the control gate in order to improve the erase speed of a split-gate flash memory cell.

It is yet another object of the present invention to provide a method of annealing the polysilicon or the amorphous silicon of the floating gate of a cell in order to improve the erase speed of a split-gate flash memory cell.

These objects are accomplished providing a silicon substrate having a plurality of active and field regions defined; forming a floating gate oxide layer over said substrate; forming a first polycrystalline silicon layer over said floating gate oxide layer; performing a high temperature anneal of said first polycrystalline silicon layer to recrystallize the silicon to form a smooth surface with small grain size; patterning and forming a poly-oxide cap with a well-defined bird's beak over said polycrystalline silicon layer having said smooth surface with said small grain size; using said poly-oxide cap with a well-defined bird's beak as a hard mask, etching said first polycrystalline silicon layer to form a floating gate with a sharp poly-tip underlying said bird's beak; forming a thin inter-poly oxide layer over said poly-oxide cap including said polycrystalline silicon with small grain size; and depositing a second polysilicon layer over said thin inter-poly oxide layer to form a control gate of said split-gate flash memory cell.

The objects are further accomplished by providing a silicon substrate having a plurality of active and field regions defined; forming a floating gate oxide layer over said substrate; forming an amorphous silicon layer over said floating gate oxide layer; performing a high temperature anneal of said amorphous silicon layer to recrystallize the silicon to form a smooth recrystallized silicon layer with small grain size; patterning and forming a poly-oxide cap with a well-defined bird's beak over said recrystallized silicon layer having said smooth surface with said small grain size; using said poly-oxide cap with a well-defined bird's beak as a hard mask, etching said recrystallized silicon layer to form a floating gate with a sharp poly-tip underlying said bird's beak; forming a thin inter-poly oxide layer over said poly-oxide cap including said recrystallized silicon layer with small grain size; and depositing a second polysilicon layer over said thin inter-poly oxide layer to form a control gate of said split-gate flash memory cell.

BRIEF DESCRIPTION OF THE DRAWINGS

FIGS. 1a–1f are cross-sectional views of a portion of a semiconductor substrate showing the steps of forming a conventional split-gate flash memory cell with a conventional gate birds' beak.

FIGS. 3a–3f show the rough condition of the surface of the first polysilicon layer as it is deposited on the substrate.

In FIGS. 4a–4f and 5a–5f, similar numeral references are used to reference similar parts as in FIGS. 2a–2f and 3a–3f. More specifically:

FIG. 5a is a cross-sectional view of a portion of a semiconductor substrate showing the forming of a floating gate oxide layer followed by the forming of a first polysilicon layer or an amorphous silicon layer over the substrate of this invention. FIG. 5a also shows the smooth surface of a recrystallized polysilicon or amorphous layer after the high-temperature treatment of the same layer, according to the present invention.

FIG. 5b is a cross-sectional view of a portion of a semiconductor substrate showing the forming of a nitride layer over the substrate of FIG. 5a, and the patterning of the nitride layer corresponding to the floating gate regions of the substrate, according to the present invention.

FIG. 5c is a cross-sectional view of a portion of a semiconductor substrate showing the forming of a poly-oxide "cap" with the disclosed well-defined bird's beak over the floating gate to be formed in the patterned regions of FIG. 5b, according to the present invention.

FIG. 5d is a cross-sectional view of a portion of a semiconductor substrate showing the etching of the recrystallized layer of FIG. 5c to form the floating gate with the well-defined poly tip of this invention.

FIG. 5e is a cross-sectional view of a portion of a semiconductor substrate showing the forming of a thin inter-gate oxide layer over the poly-oxide cap of FIG. 5d, according to the present invention.

FIG. 5f is a cross-sectional view of a portion of a semiconductor substrate showing the forming of the control gate of the split-gate flash memory cell of this invention.

DESCRIPTION OF THE PREFERRED EMBODIMENTS

Figure 2A:
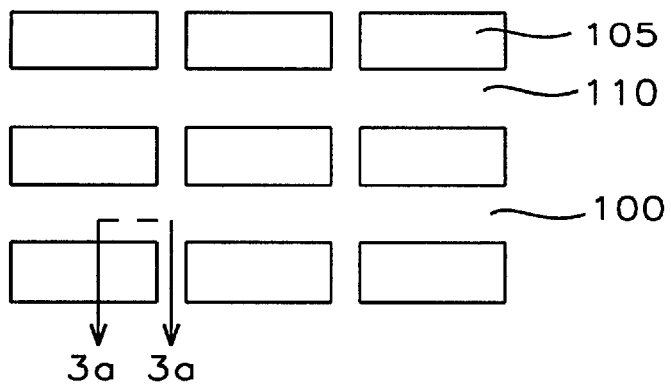
FIGS. 2a–2f are the top views of a portion of a semiconductor substrate showing the forming of a split-gate flash memory cell as practiced in the current manufacturing line.

Referring now to the drawings, FIGS. 2a–2f and 3a–3f show steps of forming a split-gate flash memory cell employing current methods in the present manufacturing line. FIGS. 4a–4f and 5a–5f show preferred embodiments of the present invention. It will become apparent from the figures that the control of the geometry of the so-called bird's beak (BB) formed at the corner of the poly-oxide "cap" over the floating gate is important in determining the size and shape of a poly tip that is formed under the BB at the corner of the floating gate. As described earlier, the sharpness of the poly-tip, in turn, determines the erase speed of the cell. The programming and erase speed can further be enhanced by providing a thin inter-gate layer between the floating gate and control gate of the cell.

Figure 2B:
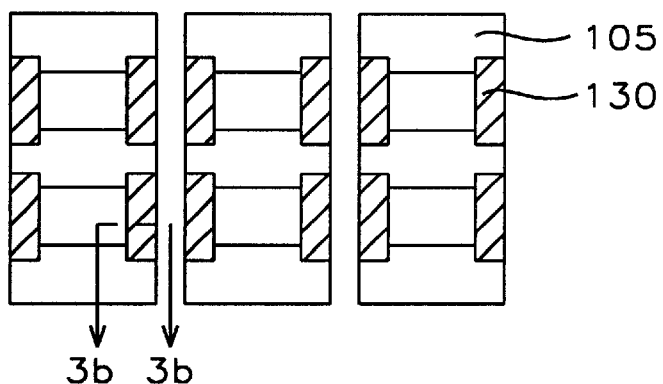
Figure 2C:
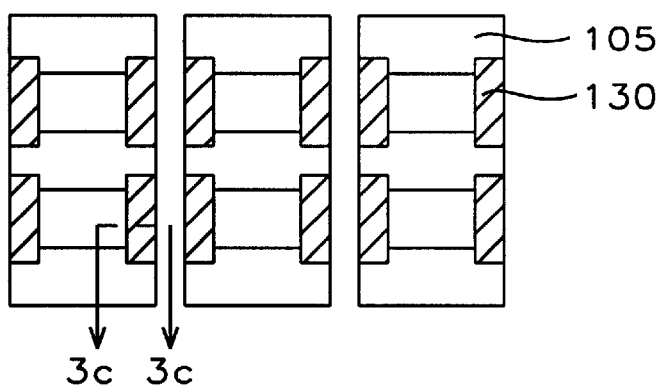

In FIGS. 2a–2f, top views of a semiconductor substrate are shown corresponding to different process steps as practiced in the current manufacturing line. Cross-sectional views taken at various sections of substrate (100) in FIGS. 2a–2f are shown in FIGS. 3a–3f. Preferably, substrate (100) comprises silicon, and is provided with active device regions (110) and passive field regions (105) already defined, as is well known in the art. Following the current practice in the manufacturing line, a floating gate oxide layer (120) is first formed over the substrate as shown in the same FIG. 3a. Then, a first polycrystalline layer (130) is formed over the floating gate oxide layer, which is also shown in FIG. 3a. For clarity, layers (120) and (130) are not shown in the top view of FIG. 2a. The process continues by the forming of nitride layer (140) as shown in FIGS. 2b and 3b. The nitride layer is then patterned to have openings (145) corresponding to the floating gate regions that are to be formed on the substrate, as shown in FIGS. 2b and 3b. Next, portions of the polycrystalline silicon layer that are exposed at the bottom of openings (145) are wet oxidized to form poly-oxide (150) as shown in FIGS. 2c and 3c.

It will be noted in FIG. 3c that because a polysilicon layer, that is, a polycrystalline silicon layer, usually comprises myriad of small single crystal regions each of which can be large and rough, as referenced by numeral (135) in the cross-sectional view in FIGS. 3a–3c, the resulting so-called bird's beak (BB) (137) can become out of control. That is, the rough surface (135) shown in FIGS. 3a–3c can cause the BB of the poly-oxide "cap" to have irregular shapes, including the case of being broken as referenced by numeral (137a), and not so broken as referenced by (137b). The polysilicon tip underlying the bird's beak also becomes irregular in shape. Thus, the tip underneath (137a) is short and stubby in comparison with the other tip underlying (137b). Furthermore, (137a) is at a different elevation than (137b). Consequently, the charge transfer through the poly tip between the floating gate and the control gate to be formed becomes erratic and unreliable with the concomitant variability in the erase speed of the cell. The variability and the degradation in the charge transfer is further exacerbated by the variability in the thickness of the inter-gate oxide that is grown between the floating gate and the control gate of the cell.

Figure 2D:
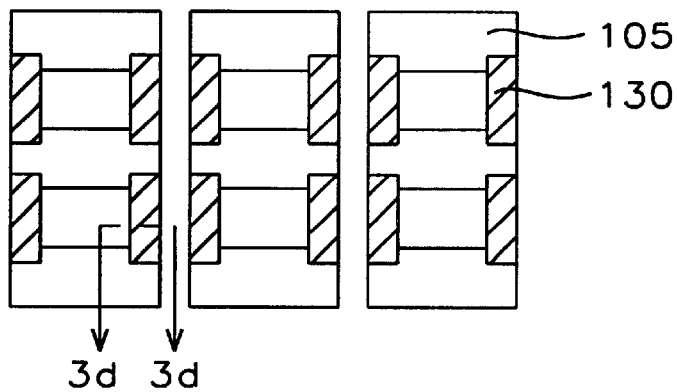
Figure 2E:
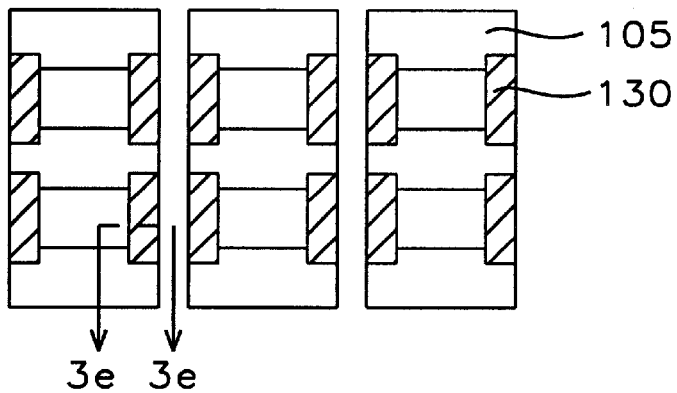
Figure 2F:
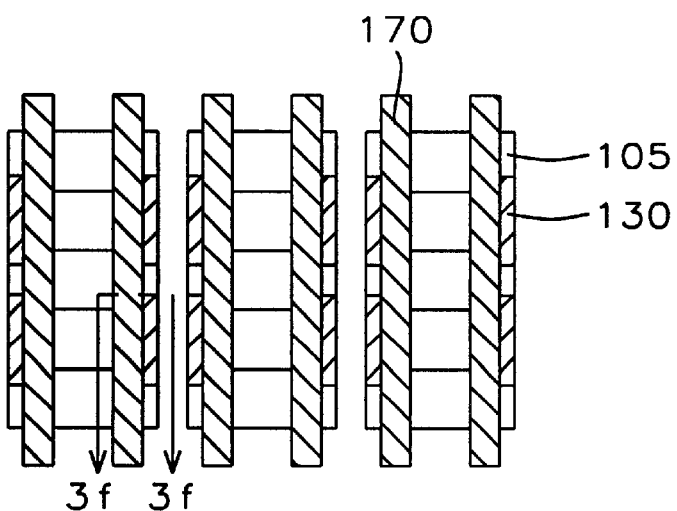
Figure 3A:
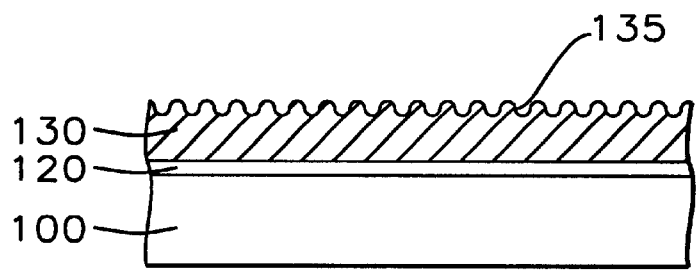
FIGS. 3a–3f show the cross sectional views of the substrate of FIGS. 2a–2f taken at sections shown in FIGS. 2a–2f. Specifically.
Figure 3B:
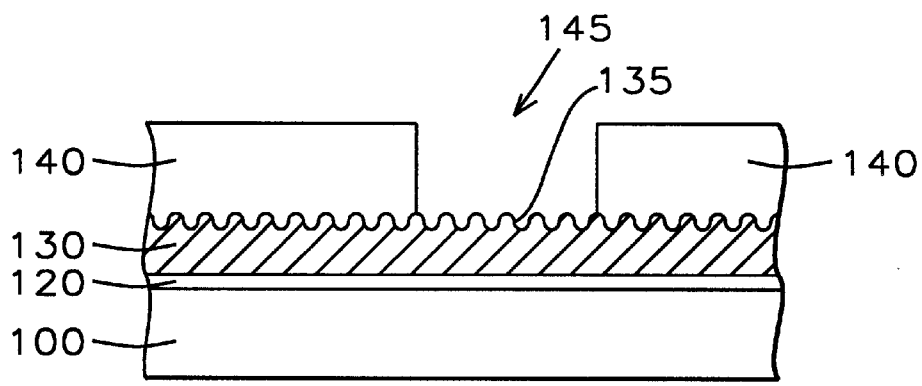
Figure 3C:
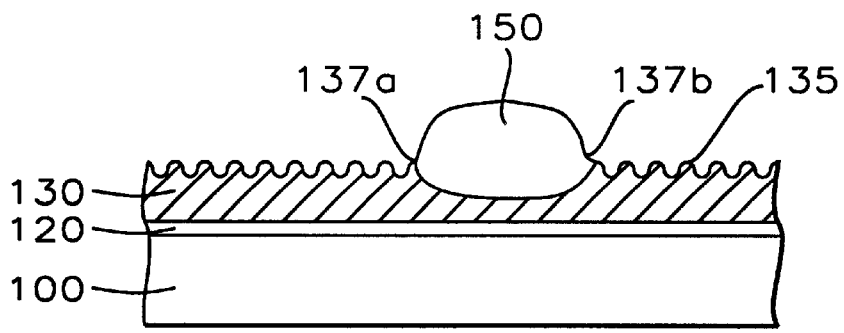
Figure 3D:
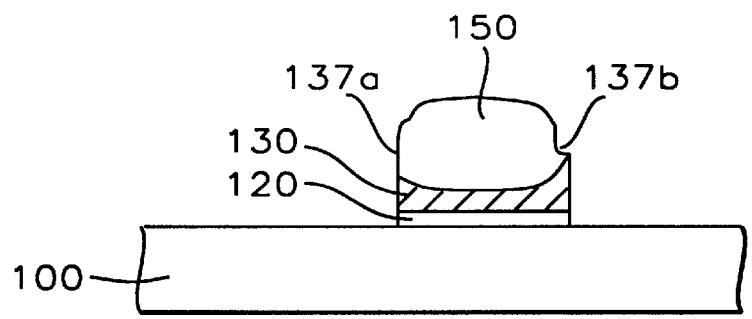
Figure 3E:
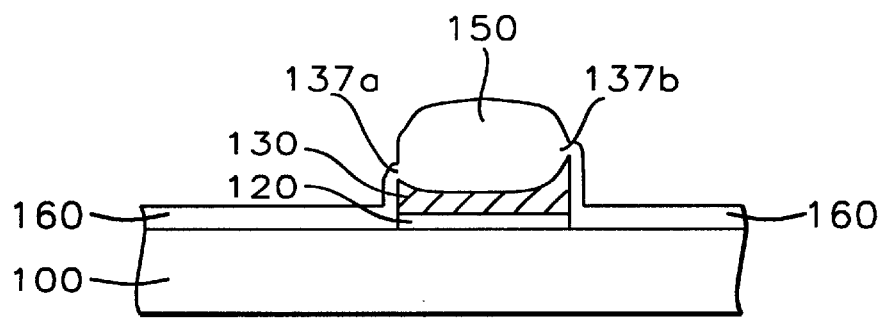
Figure 3F:
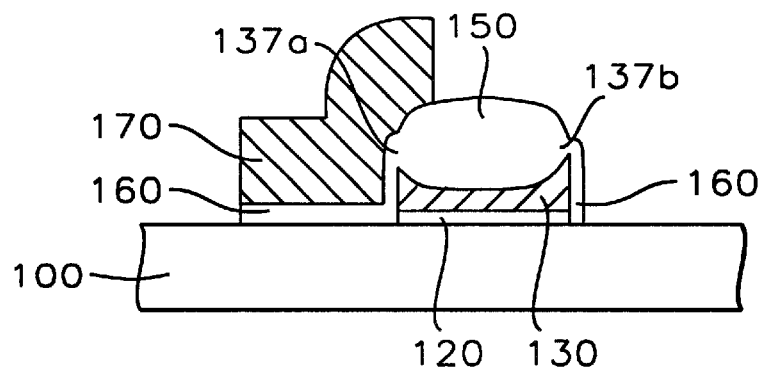

The floating gate is formed by first removing the nitride layer after the forming of the poly-oxide cap layer, as shown in FIG. 3c, and then removing portions of the first polysilicon layer not covered by the poly-oxide cap as shown in FIGS. 2d and 3d. Next, inter-gate oxide layer (160) is grown over the floating gate, as shown in FIGS. 2e and 3e, and the cell is completed by forming a second polysilicon layer over the inter-gate oxide layer and, hence patterning it to form control gate (170), as shown in FIGS. 2f and 3f.

Figure 4A:
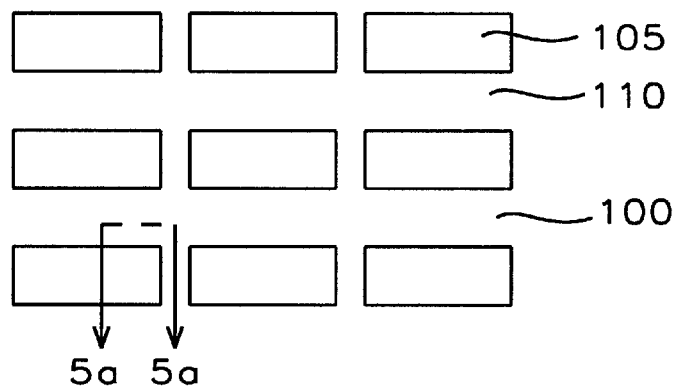
FIGS. 4a–4f are the top views of a portion of a semiconductor substrate showing the preferred embodiment of the forming of a split-gate flash memory cell of this invention.
Figure 4B:
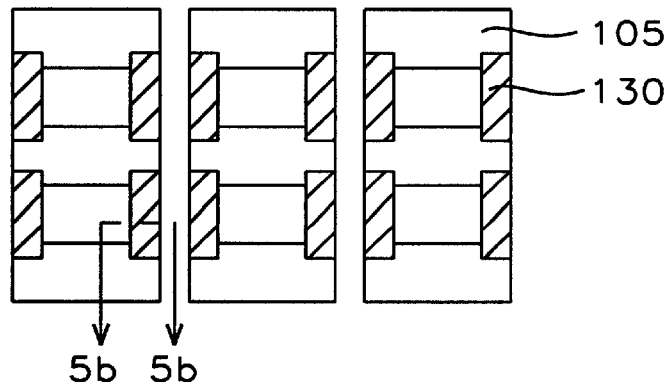
Figure 4C:
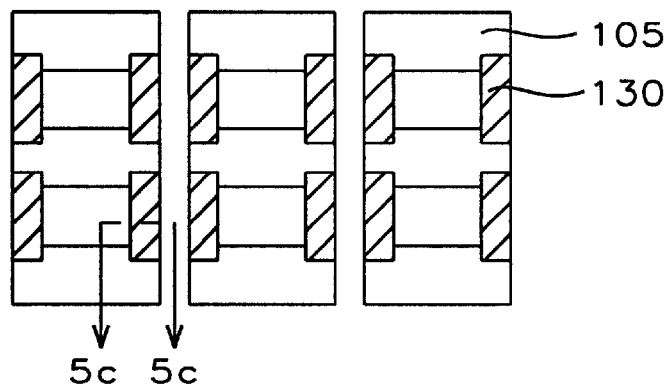
Figure 4D:
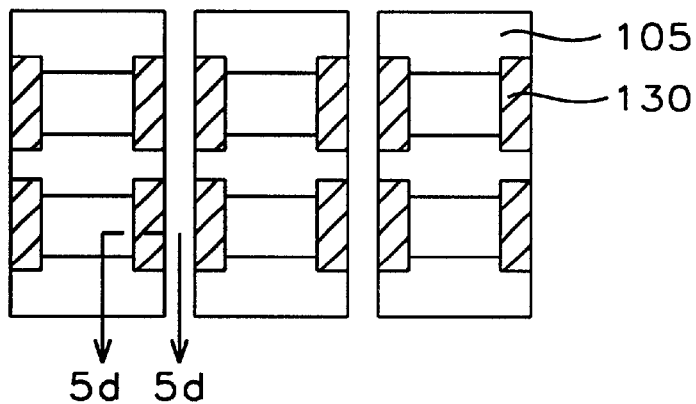
Figure 4E:
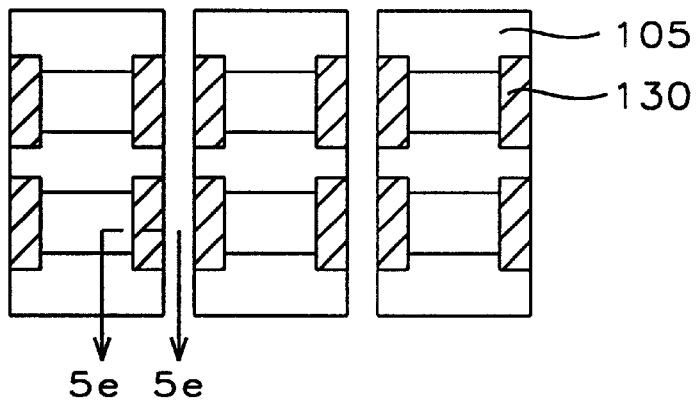

In the preferred embodiments of the present invention, the problem of rugged and rough surface of the first polysilicon layer is remedied so that the forming of the bird's beak is brought under control. (In FIGS. 4a–4f and 5a–5f, similar numeral references are used to reference similar parts as in FIGS. 2a–2f and 3a–3f). As shown in FIG. 5a, floating gate oxide layer (120) is formed over substrate (100), followed by the forming of first polycrystalline silicon layer (130). These two layers are not shown in the top view in FIG. 4a for clarity. Floating gate oxide (120) can be formed by thermal oxidation process at a temperature between about 825 to 925° C. Alternatively, the floating gate oxide can be formed by an atmospheric or low pressure chemical vapor deposition (LPCVD) process as is well known. Preferably, floating gate oxide layer (120) has a thickness between about 75 to 85 angstroms (Å). First polysilicon layer (130) is deposited over the floating gate oxide through reduction of $SiH_4$ using LPCVD at a temperature between about 560 to 630° C. The preferred thickness of the first layer of polysilicon is between about 1100 to 1300 Å.

At the next step, and as a main feature and key aspect of the present invention, first polycrystalline layer (130) is annealed at a high temperature. The preferred temperature is between about 900 to 1000° C., and is accomplished in an inert atmosphere or vacuum. The high temperature annealing recrystallizes the polysilicon, thereby resulting in smaller grain size and smoother surface, as shown by reference numeral (135) in FIG. 5a. As an alternate and second embodiment, amorphous silicon is used in place of the polysilicon for layer (130) if an amorphous floating gate is desired. Amorphous silicon, as is known, is smooth by its nature. The pre-high-temperature annealing of the amorphous silicon at the same temperature range as before, namely, between about 900 to 1000° C. transfers the smoothness to the recrystallized silicon. Consequently, a smooth surface, (135), shown in FIG. 5a, results.

Figure 5A:
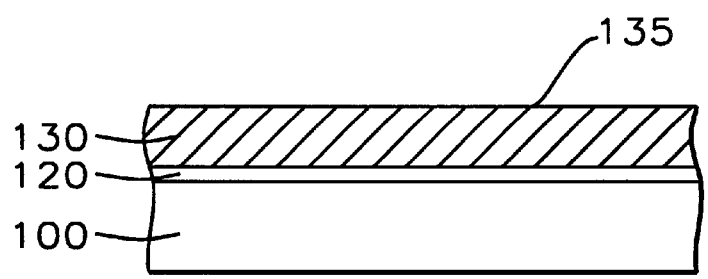
FIGS. 5a–5f show the cross sectional views of the substrate of FIGS. 4a–4f taken at sections shown in FIGS. 4a–4f.
Figure 5B:
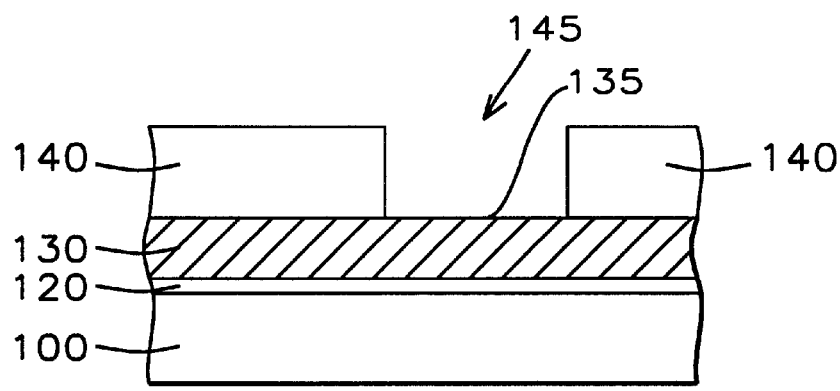

Following the high temperature anneal of layer (130), nitride layer (140) is formed by reacting dichlorosilane ($SiCl_2H_2$) with ammonia ($NH_3$) in an LPCVD at a temperature between about 750 to 850° C. The preferred thickness of the nitride layer is between about 750 to 850 Å. Then, using conventional techniques, a first photoresist layer (not shown) is spun over the nitride layer to form a photoresist mask having patterns corresponding to areas where floating gates are to be defined. The patterns are then etched into the nitride layer forming openings where the underlying recrystallized layer is exposed, as shown in FIGS. 4b and 5b. The etching is accomplished using a recipe comprising gases Ar, $CHF_3$, $C_4F_8$. Afterwards, the photoresist mask is removed using oxygen plasma ashing as is done conventionally.

Figure 5C:
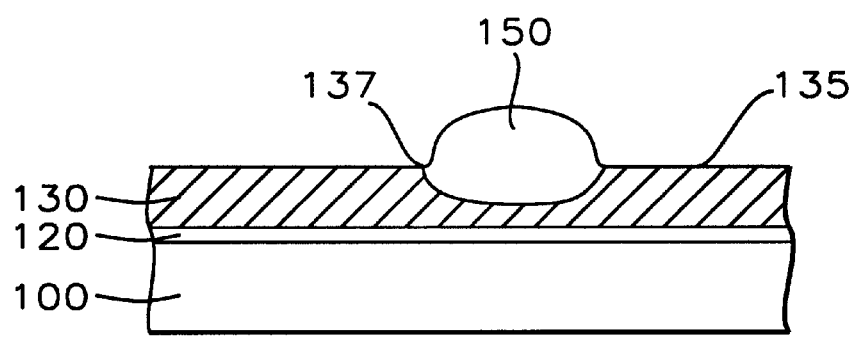
Figure 5D:
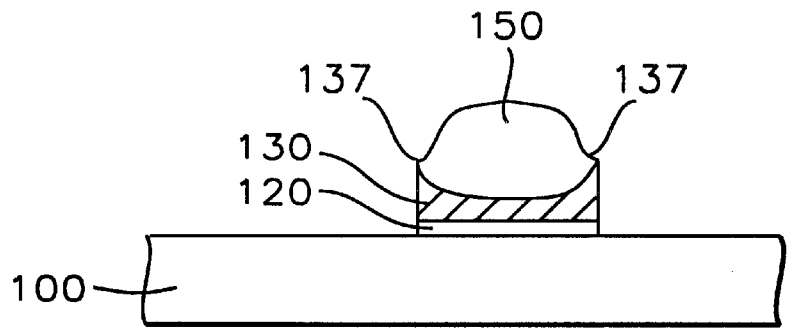

The portions of the underlying recrystallized layer exposed in the patterned openings of the nitride layer are next oxidized using a wet process comprising water or wet $O_2$. The resulting oxidation produces poly-oxide "cap" (135) as shown in FIGS. 4c and 5c. The preferred thickness of the poly-oxide is between about 1400 to 1600 Å. Once the poly-oxide has been formed, the nitride layer is removed by using a wet solution of $H_3PO_4$, or, phosphoric acid, as shown in FIGS. 4c and 5c. The same etch recipe used for patterning the nitride layer before may also be used to remove the remaining nitride layer. The poly-oxide so formed is now used as a hard mask to etch the remaining portions of the recrystallized layer not covered by the poly-oxide mask as shown in FIGS. 4d and 5d. This is accomplished by using an etch recipe comprising $Cl_2$ and HBr gases. The recrystallized silicon layer protected under the poly-oxide forms the floating gate of this invention which is separated from the substrate by the floating gate oxide layer (120) as seen in FIG. 5d.

Figure 5E:
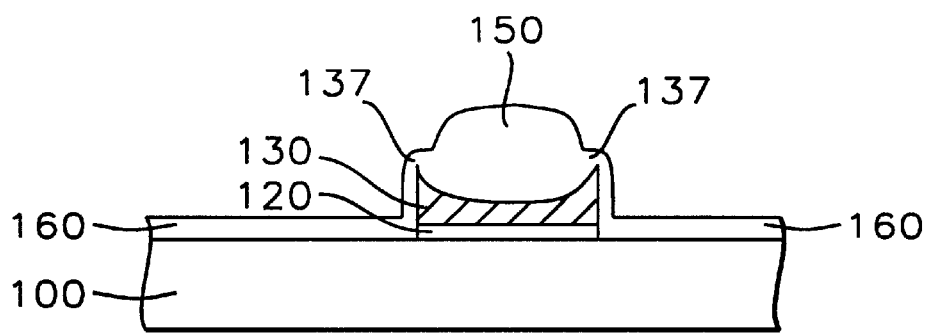

It will be noted in FIG. 5d that the bird's beak (BB) (137) is well-defined and the corresponding poly-tip underneath the BB is also well-defined and sharp. This is because the recrystallized polysilicon or amorphous silicon layer (130) was rendered smooth with the disclosed method of the earlier high-temperature annealing step of the invention. Also, it is found that the high temperature treatment of layer (130) prior to the poly oxidation step preempts any further grain enlargement and surface roughening of the layer. In addition, in the case of both the recrystallized first polysilicon layer and the transformed recrystallized amorphous layer after heat treatment, the thermal growth of the subsequent inter-gate layer provides a relatively thin oxide. As it will be known to those skilled in the art, a thinner inter-gate oxide improves the erase speed of the cell. It is preferred that the thickness of inter-gate oxide layer (160) shown in FIGS. 4e and 5e is between about 100 to 200 Å, and that it is grown at a temperature range between about 800 to 1000° C.

Figure 4F:
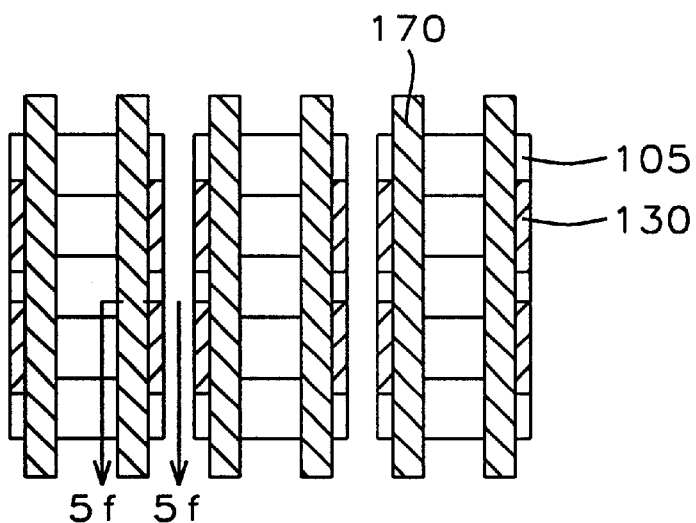
Figure 5F:
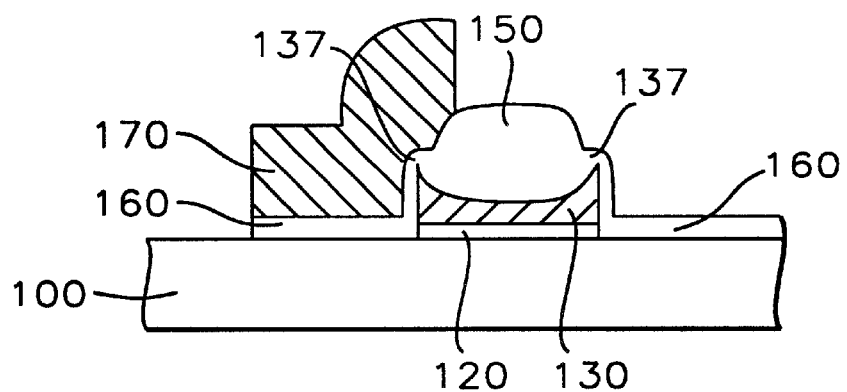

As a final step, a second polysilicon layer is deposited over the inter-gate oxide layer and is patterned to form control gate (170), as shown in FIGS. 4f and 5f. Preferably, the second polysilicon layer is formed using silicon source $SiH_4$ in an LPCVD chamber at a temperature between about 550 to 620° C., and that it has a thickness between about 1600 to 2600 Å.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for forming poly tips of different sharpness and geometries.

While the invention has been particularly shown and described with reference to the preferred embodiments thereof, it will be understood by those skilled in the art that various changes in form and details may be made without departing from the spirit and scope of the invention.

What is claimed is:

1. A method to improve the control of bird's beak profile of poly in split gate flash memory cell comprising the steps of:

providing a silicon substrate having a plurality of active and field regions defined;

forming a floating gate oxide layer over said substrate;

forming a first polycrystalline silicon layer over said floating gate oxide layer;

performing a high temperature anneal of said first polycrystalline silicon layer to form a recrystallized layer having a smooth surface with small grain size;

patterning and forming a poly-oxide cap with a well-defined bird's beak over said polycrystalline silicon layer having said smooth surface with said small grain size;

etching said recrystallized layer to form a floating gate with a sharp poly-tip underlying said bird's beak, using said poly-oxide cap with a well-defined bird's beak as a hard mask;

forming a thin inter-poly oxide layer over said poly-oxide cap including said recrystallized layer having a smooth surface with a small grain size; and depositing a second polysilicon layer over said thin inter-poly oxide layer to form a control gate of said split-gate flash memory cell.

2. The method of claim 1, wherein said forming said floating gate oxide layer is accomplished by thermal growth at a temperature between about 825 to 925° C.

3. The method of claim 1, wherein said floating gate oxide layer has a thickness between about 75 to 85 angstroms (Å).

4. The method of claim 1, wherein said forming said first polycrystalline silicon layer is accomplished with silicon source $SiH_4$ using LPCVD at a temperature between about 560 to 630° C.

5. The method of claim 1, wherein said first polycrystalline silicon layer has a thickness between about 1100 to 1300 Å.

6. The method of claim 1, wherein said performing said high temperature anneal is accomplished at a temperature between about 900 to 1000° C.

7. The method of claim 1, wherein said poly-oxide cap is formed by oxidizing said recrystallized layer at a temperature between about 850 to 950° C.

8. The method of claim 1, wherein said poly-oxide cap has a thickness between about 1400 to 1600° C.

9. The method of claim 1, wherein said etching said recrystallized layer using said poly-oxide as a hard mask is accomplished with a recipe comprising gases HBr, and $Cl_2$.

10. The method of claim 1, wherein said thin inter-poly oxide is grown at a temperature between about 800 to 1000° C. to a thickness between about 100 to 200 Å.

11. The method of claim 1, wherein said depositing a second polycrystalline silicon layer over said inter-poly oxide is accomplished with silicon source $SiH_4$ using LPCVD at a temperature between about 550 to 620° C.

12. The method of claim 1, wherein said second polycrystalline silicon layer to form a control gate has a thickness between about 1600 to 2600 Å.

13. A method to improve the control of bird's beak profile of poly in split gate flash memory cell comprising the steps of:

providing a silicon substrate having a plurality of active and field regions defined;

forming a floating gate oxide layer over said substrate;

forming an amorphous silicon layer over said floating gate oxide layer;

performing a high temperature anneal of said amorphous silicon layer to recrystallize said amorphous layer to form a recrystallized layer having a smooth surface with a small grain size;

patterning and forming a poly-oxide cap with a well-defined bird's beak over said recrystallized layer having said smooth surface with said small grain size;

etching said recrystallized layer to form a floating gate with a sharp poly-tip underlying said bird's beak by using said poly-oxide cap with a well-defined bird's beak as a hard mask;

forming a thin inter-poly oxide layer over said poly-oxide cap including said recrystallized layer having a smooth surface with a small grain size; and depositing a second polysilicon layer over said thin inter-poly oxide layer to form a control gate of said split-gate flash memory cell.

14. The method of claim 13, wherein said forming said floating gate oxide layer is accomplished by thermal growth at a temperature between about 825 to 925° C.

15. The method of claim 13, wherein said floating gate oxide layer has a thickness between about 75 to 85 angstroms (Å).

16. The method of claim 13, wherein said amorphous silicon layer has a thickness between about 1100 to 1300 Å.

17. The method of claim 13, wherein said performing said high temperature anneal is accomplished at a temperature between about 900 to 1000° C.

18. The method of claim 13, wherein said poly-oxide cap is formed by oxidizing said recrystallized silicon layer at a temperature between about 850 to 950° C.

19. The method of claim 13, wherein said poly-oxide cap has a thickness between about 1400 to 1600° C.

20. The method of claim 13, wherein said etching said recrystallized silicon using said poly-oxide as a hard mask is accomplished with a recipe comprising gases HBr, and $Cl_2$.

21. The method of claim 13, wherein said thin inter-poly oxide is grown at a temperature between about 800 to 1000° C. to a thickness between about 100 to 200 Å.

22. The method of claim 13, wherein said depositing a second polycrystalline silicon layer over said inter-poly oxide is accomplished with silicon source $SiH_4$ using LPCVD at a temperature between about 550 to 620° C.

23. The method of claim 13, wherein said second polycrystalline silicon layer to form a control gate has a thickness between about 1600 to 2600 Å.

24. A method to improve the control of bird's beak profile of poly in split gate flash memory cell comprising the steps of:

providing a silicon substrate having a plurality of active and field regions defined;

forming a floating gate oxide layer over said substrate;

forming a first polycrystalline silicon layer over said floating gate oxide layer;

performing a high temperature anneal of said first poly-crystalline silicon layer to form a recrystallized having a smooth surface with a small grain size;

forming a nitride layer over said recrystallized layer;

forming openings in said nitride layer to expose portions of said recrystallized layer corresponding to a floating gate pattern;

oxidizing portions of said recrystallized layer exposed in said openings in said layer of nitride to form a poly-oxide cap with a well-defined bird's beak over said recrystallized layer having said smooth surface with said small grain size;

removing said nitride layer;

etching said recrystallized layer to form a floating gate with a sharp poly-tip underlying said bird's beak using said poly-oxide cap with a well-defined bird's beak as a hard mask;

forming a thin inter-poly oxide layer over said poly-oxide cap including said recrystallized layer having a smooth surface with a small grain size; and depositing a second polysilicon layer over said thin inter-poly oxide layer to form a control gate of said split-gate flash memory cell.

25. The method of claim 24, wherein said forming said floating gate oxide layer is accomplished by thermal growth at a temperature between about 825 to 925° C.

26. The method of claim 24, wherein said floating gate oxide layer has a thickness between about 75 to 85 angstroms (Å).

27. The method of claim 24, wherein said forming said first polycrystalline silicon layer is accomplished with silicon source $SiH_4$ using LPCVD at a temperature between about 560 to 630° C.

28. The method of claim 24, wherein said first polycrystalline silicon layer has a thickness between about 1100 to 1300 Å.

29. The method of claim 24, wherein said performing said high temperature anneal is accomplished at a temperature between about 900 to 1000° C.

30. The method of claim 24, wherein said forming said nitride layer is accomplished with LPCVD at a temperature between about 750 to 850° C. by reacting dichlorosilane ($SiCl_2H_2$) with ammonia ($NH_3$).

31. The method of claim 24, wherein said nitride layer has a thickness between about 750 to 850 Å.

32. The method of claim 24, wherein said forming said opening in said nitride layer is accomplished with etch recipe comprising gases Ar, $CHF_3$, $C_4F_8$.

33. The method of claim 24, wherein said forming said poly-oxide cap is formed by oxidizing said portions of said recrystallized layer at a temperature between about 850 to 950° C.

34. The method of claim 24, wherein said poly-oxide cap has a thickness between about 1400 to 1600 Å.

35. The method of claim 24, wherein said removing said nitride layer is accomplished with a recipe comprising a wet solution of $H_3PO_4$.

36. The method of claim 24, wherein said etching said recrystallized layer using said poly-oxide as a hard mask is accomplished with a recipe comprising gases HBr, and $Cl_2$.

37. The method of claim 24, wherein said thin inter-poly oxide is grown at a temperature between about 800 to 1000° C. to a thickness between about 100 to 200 Å.

38. The method of claim 24, wherein said depositing a second polycrystalline silicon layer over said inter-poly oxide is accomplished with silicon source $SiH_4$ using LPCVD at a temperature between about 550 to 620° C.

39. The method of claim 24, wherein said second polycrystalline silicon layer to form a control gate has a thickness between about 1600 to 2600 Å.

40. A method to improve the control of bird's beak profile of poly in split gate flash memory cell comprising the steps of:

providing a silicon substrate having a plurality of active and field regions defined;

forming a floating gate oxide layer over said substrate;

forming an amorphous silicon layer over said floating gate oxide layer;

performing a high temperature anneal of said amorphous silicon layer to form a recrystallized layer having a smooth surface having small grain size;

forming a nitride layer over said recrystallized layer;

forming openings in said nitride layer to expose portions of said recrystallized layer corresponding to a floating gate pattern;

oxidizing portions of said recrystallized layer exposed in said openings in said layer of nitride to form a poly-oxide cap with a well-defined bird's beak over said recrystallized layer having said smooth surface with said small grain size;

removing said nitride layer;

etching said recrystallized layer to form a floating gate with a sharp poly-tip underlying said bird's beak by using said poly-oxide cap with a well-defined bird's beak as a hard mask;

forming a thin inter-poly oxide layer over said poly-oxide cap including said recrystallized layer having a smooth surface with a small grain size; and depositing a second polysilicon layer over said thin inter-poly oxide layer to form a control gate of said split-gate flash memory cell.

41. The method of claim 40, wherein said forming said floating gate oxide layer is accomplished by thermal growth at a temperature between about 825 to 925° C.

42. The method of claim 40, wherein said floating gate oxide layer has a thickness between about 75 to 85 angstroms (Å).

43. The method of claim 40, wherein said amorphous silicon layer has a thickness between about 1100 to 1300 angstroms (Å).

44. The method of claim 40, wherein said performing said high temperature anneal is accomplished at a temperature between about 900 to 1000° C.

45. The method of claim 40, wherein said forming said nitride layer is accomplished with LPCVD at a temperature between about 750 to 850° C. by reacting dichlorosilane ($SiCl_2H_2$) with ammonia ($NH_3$).

46. The method of claim 40, wherein said nitride layer has a thickness between about 750 to 850 Å.

47. The method of claim 40, wherein said forming said opening in said nitride layer is accomplished with etch recipe comprising gases Ar, $CHF_3$, $C_4F_8$.

48. The method of claim 40, wherein said forming said poly-oxide cap is formed by oxidizing said portions of said recrystallized layer at a temperature between about 850 to 950° C.

49. The method of claim 40, wherein said poly-oxide cap has a thickness between about 1400 to 1600° C.

50. The method of claim 40, wherein said removing said nitride layer is accomplished with a recipe comprising recipe comprising a wet solution of $H_3PO_4$.

51. The method of claim 40, wherein said etching said recrystallized layer using said poly-oxide as a hard mask is accomplished with a recipe comprising gases HBr, and $Cl_2$.

52. The method of claim 40, wherein said thin inter-poly oxide is grown at a temperature between about 800 to 1000° C. to a thickness between about 100 to 200 Å.

53. The method of claim 40, wherein said depositing a second polycrystalline silicon layer over said inter-poly oxide is accomplished with silicon source $SiH_4$ using LPCVD at a temperature between about 550 to 620° C.

54. The method of claim 40, wherein said second polycrystalline silicon layer to form a control gate has a thickness between about 1600 to 2600 Å.

* * * * *